United States Patent
Yang et al.

(10) Patent No.: US 9,614,020 B2
(45) Date of Patent: Apr. 4, 2017

(54) OXIDE SEMICONDUCTOR DEVICES, METHODS OF FORMING OXIDE SEMICONDUCTOR DEVICES AND ORGANIC LIGHT EMITTING DISPLAY DEVICES INCLUDING OXIDE SEMICONDUCTOR DEVICES

(71) Applicant: Samsung Display Co., Ltd., Yongin (KR)

(72) Inventors: Shin-Hyuk Yang, Seongnam-si (KR); Tae-Young Kim, Seongnam-si (KR); Hye-Hyang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/817,900

(22) Filed: Aug. 4, 2015

(65) Prior Publication Data

US 2016/0254334 A1    Sep. 1, 2016

(30) Foreign Application Priority Data

Feb. 26, 2015 (KR) .................. 10-2015-0027073

(51) Int. Cl.
| | |
|---|---|
| *H01L 31/036* | (2006.01) |
| *H01L 27/32* | (2006.01) |
| *H01L 29/786* | (2006.01) |
| *H01L 29/66* | (2006.01) |
| *H01L 29/24* | (2006.01) |
| *H01L 29/423* | (2006.01) |
| *H01L 21/477* | (2006.01) |
| *H01L 21/4757* | (2006.01) |

(52) U.S. Cl.
CPC ........ *H01L 27/3262* (2013.01); *H01L 21/477* (2013.01); *H01L 21/47576* (2013.01); *H01L 27/3248* (2013.01); *H01L 29/24* (2013.01); *H01L 29/42356* (2013.01); *H01L 29/42384* (2013.01); *H01L 29/66969* (2013.01); *H01L 29/7869* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,053,773 | B2 | 11/2011 | Shin et al. |
| 8,879,014 | B2 | 11/2014 | Liu |
| 2016/0254334 | A1* | 9/2016 | Yang .................. H01L 27/3262 |

FOREIGN PATENT DOCUMENTS

| | | |
|---|---|---|
| KR | 10-2008-0104756 | 12/2008 |
| KR | 10-2010-0060214 | 6/2010 |
| KR | 10-2010-0094404 | 8/2010 |
| KR | 10-2011-0070078 | 6/2011 |

\* cited by examiner

*Primary Examiner* — Jack Chen
(74) *Attorney, Agent, or Firm* — H.C. Park & Associates, PLC (57) ABSTRACT

An oxide semiconductor device includes a first insulation layer pattern and a second insulation layer pattern disposed on a substrate, an active layer disposed on the first and second insulation layer patterns, the active layer including a source region including the first insulation layer pattern, a drain region including the second insulation layer pattern, and a channel region disposed between the source and drain regions, a source electrode contacting the source region, and a drain electrode contacting the drain region.

11 Claims, 8 Drawing Sheets

OXIDE SEMICONDUCTOR DEVICES, METHODS OF FORMING OXIDE SEMICONDUCTOR DEVICES AND ORGANIC LIGHT EMITTING DISPLAY DEVICES INCLUDING OXIDE SEMICONDUCTOR DEVICES

CROSS-REFERENCE TO RELATED APPLICATION

This application claims priority from and the benefit of Korean Patent Application No. 10-2015-0027073, filed on Feb. 26, 2015, which is hereby incorporated by reference for all purposes as if fully set forth herein.

BACKGROUND

Field

Exemplary embodiments of the present invention relate to oxide semiconductor devices, method of forming the oxide semiconductor devices, and organic light emitting display devices including the oxide semiconductor devices. More particularly, exemplary embodiments of the present invention relate to oxide semiconductor devices having a source region and a drain formed from insulation layer patterns, method of forming the oxide semiconductor devices, and organic light emitting display devices including the oxide semiconductor devices.

Discussion of the Background

Next generation display devices with high resolution and large dimensions may require semiconductor devices that have high performance. Oxide semiconductor devices including active layers of oxide semiconductor with high carrier mobility have been researched for high resolution display devices. The oxide semiconductor device may have an inverted staggered structure that includes an etch stop layer disposed on a channel region of the active layer and a gate electrode located below the active layer.

In a conventional inverted staggered type oxide semiconductor device, length of the etch stop layer may not be reduced because of the alignment margin for the etch stop layer, so that the length of the active layer may not be properly reduced. Further, a source electrode and a drain electrode may overlap side portions of the gate electrode below the etch stop layer, such that parasitic capacitance between the gate electrode, the source electrode, and the drain electrode may be increased. As a result, the conventional oxide semiconductor device may not have required electrical characteristics and reduced dimensions.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide oxide semiconductor devices including source and drain regions derived from insulation layer patterns containing impurities to improve electrical characteristics.

Exemplary embodiments of the present invention also provide methods of forming oxide semiconductor devices including source and drain regions derived from insulation layer patterns containing impurities to improve electrical characteristics.

Exemplary embodiments of the present invention further provide organic light emitting display devices including the oxide semiconductor devices.

Additional aspects will be set forth in the detailed description which follows, and, in part, will be apparent from the disclosure, or may be learned by practice of the inventive concept.

According to an exemplary embodiment of the present invention, an oxide semiconductor device includes a substrate, a first insulation layer pattern and a second insulation layer pattern disposed on the substrate, an active layer disposed on the first and second insulation layer patterns, the active layer including a source region including the first insulation layer pattern, a drain region including the second insulation layer pattern, and a channel region disposed between the source region and the drain region.

The source region and the drain region may include impurities diffused from the first insulation layer pattern and the second insulation layer pattern, respectively.

The impurities may include hydrogen or nitrogen.

Each of the first and the second insulation layer patterns may include at least one of silicon oxyfluoride ($SiO_xF_y$), silicon hydroxide ($Si(OH)_x$), silicon nitride ($SiN_x$), silicon oxynitride ($SiO_xN_y$), and silicon fluoronitride ($SiF_yN_x$).

The active layer may include at least one of indium (In), zinc (Zn), gallium (Ga), tin (Sn), titanium (Ti), aluminum (Al), hafnium (Hf), zirconium (Zr), and magnesium (Mg).

A length of the channel region may vary according to impurity content of the source and drain regions.

The oxide semiconductor device may further include a gate insulation layer disposed on the active layer, a gate electrode disposed on the gate insulation layer, and an insulating interlayer disposed on the gate insulation layer and the gate electrode.

The source electrode and the drain electrode may pass through the insulating interlayer and the gate insulation layer and contact the source region and the drain region, respectively.

The oxide semiconductor device may further include a gate electrode disposed on the substrate, a gate insulation layer disposed on the gate electrode and the substrate, in which the first and second insulation layer patterns may be disposed on the gate insulation layer.

The source electrode may contact portions of the first insulation layer pattern and the source region, and the drain electrode may contact portions of the second insulation layer pattern and the drain region.

The gate electrode may not overlap the source and drain electrodes.

The oxide semiconductor device may further include an etch stop layer disposed on the active layer.

According to an exemplary embodiment of the present inventions, a method for forming an oxide semiconductor device includes forming a first insulation layer pattern and second insulation layer pattern on a substrate, forming an active layer on the substrate, the first insulation layer pattern, and the second insulation layer pattern, forming a source region and a drain region, the source region and the drain region including the first insulation layer pattern and the second insulation layer pattern, respectively, forming a gate insulation layer on the active layer, forming a gate electrode on the gate insulation layer, forming an insulating interlayer on the gate insulation layer and the gate electrode, and forming a source electrode and a drain electrode passing through the insulating interlayer and the gate insulation layer, the source electrode and the drain electrode contacting the source region and the drain region, respectively.

Forming the source and drain electrodes may include diffusing impurities from the first and second insulation layer patterns into the active layer by a thermal treatment.

The thermal treatment may include an annealing process.

Forming the first and second insulation layer patterns may include forming an insulation layer on the substrate, forming a mask on the insulation layer, implanting impurities into portions of the insulation layer exposed by the mask, and patterning the insulation layer using the mask.

Forming the first and second insulation layer patterns may include forming an insulation layer including impurities on the substrate, forming a mask on the insulation layer, and patterning the insulation layer using the mask.

According to an exemplary embodiment of the present invention, an organic light emitting display device includes a substrate, an oxide semiconductor device disposed on the substrate, the oxide semiconductor device including a first insulation layer pattern, a second insulation layer pattern, an active layer including a source electrode including the first insulation pattern, a drain electrode including the second insulation pattern, and a channel region disposed between the source region and the drain region, a first electrode electrically connected to the drain electrode, a light emitting layer disposed on the first electrode, and a second electrode disposed on the light emitting layer.

The oxide semiconductor device may further include a gate insulation layer disposed on the active layer, a gate electrode disposed on the gate insulation layer, and an insulating interlayer disposed on the gate insulation layer and the gate electrode, and the source electrode and the drain electrode may pass through the insulating interlayer and the gate insulation layer and contact the source region and the drain region, respectively.

The oxide semiconductor device may further include a gate electrode disposed on the substrate, and a gate insulation layer disposed on the gate electrode and the substrate, the source electrode may contact portions of the first insulation layer pattern and the source region, and the drain electrode may contact portions of the second insulation layer pattern and the drain region.

According to exemplary embodiments of the present invention, an oxide semiconductor device including the source and drain regions formed from the first and second insulation layer patterns may have improved electrical characteristics, such as reduced contact resistance, decreased parasitic capacitance, decreased channel length, increased carrier mobility, and increased driving current. The organic light emitting display device including the oxide semiconductor device may have reduced dimensions, improved quality of images, and increased display rate of images, such that the organic light emitting display device may have high resolution and large size.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
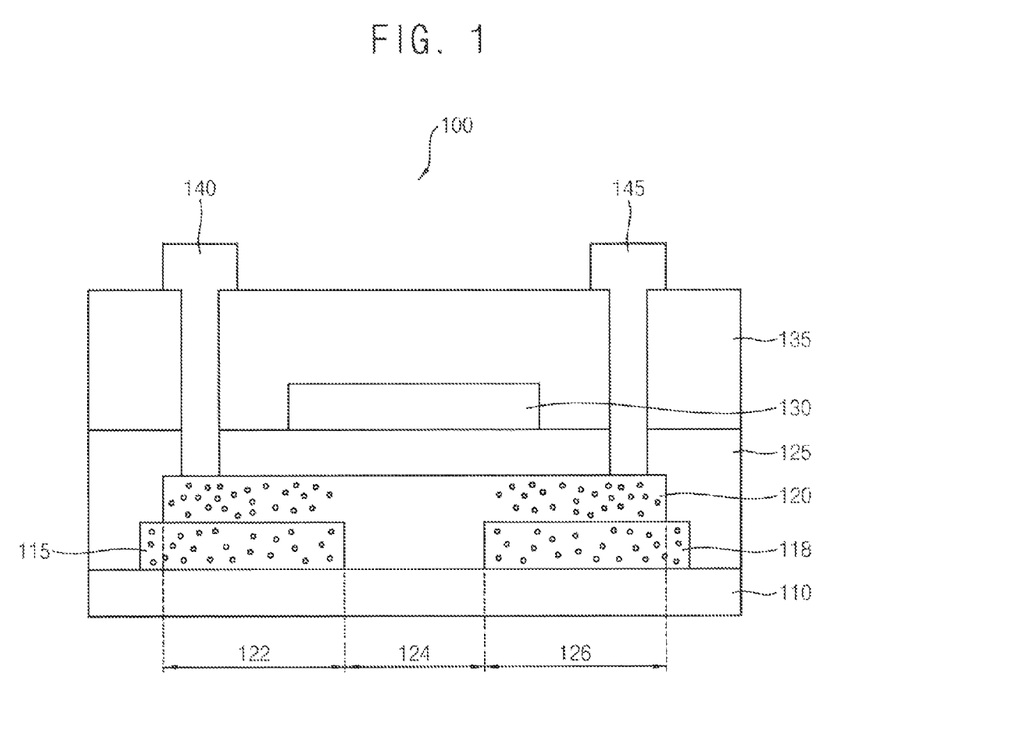
FIG. 1 is a cross-sectional view illustrating an oxide semiconductor device according to an exemplary embodiment of the present invention.

FIG. 1 is a cross-sectional view illustrating an oxide semiconductor device according to an exemplary embodiment of the present invention.

Referring to FIG. 1, an oxide semiconductor may be provided on a substrate 110. The oxide semiconductor device 100 may include a first insulation layer pattern 115, a second insulation layer pattern 118, an active layer 120, a gate insulation layer 125, a gate electrode 130, an insulating interlayer 135, a source electrode 140, and a drain electrode 145.

The substrate 110 may be a hard transparent insulation substrate such as a glass substrate, a quartz substrate, a ceramic substrate, etc. Alternatively, the substrate 110 may be a soft transparent insulation substrate such as a polyimide substrate.

The first and the second insulation layer patterns 115 and 118 may be disposed on the substrate 110 by a predetermined distance. The active layer 120 may be disposed on the substrate 110, the first insulation layer pattern 115, and the second insulation layer pattern 118. The active layer 120 may partially expose the first and the second insulation layer patterns 115 and 118.

According to the present exemplary embodiment, each of the first and the second insulation layer patterns 115 and 118 may include impurities. The impurities in the first and the second insulation layer patterns 115 and 118 may include hydrogen (H) or fluorine (F). The first and the second insulation layer patterns 115 and 118 may include silicon oxyfluoride ($SiO_xF_y$), silicon hydroxide ($Si(OH)_x$), silicon nitride ($SiN_x$), silicon oxynitride ($SiO_xN_y$), silicon fluoronitride ($SiF_yN_x$), etc.

As illustrated in FIG. 1, the first insulation layer pattern 115 and the second insulation layer pattern 118 may be at least partially overlapped with a source region 122 of the active layer 120 and a drain region 126 of the active layer 120, respectively. More particularly, the source region 122 and the drain region 126 may be positioned on the first insulation layer pattern 115 and the second insulation layer pattern 118, respectively. According to the present exemplary embodiment, the source and the drain regions 122 and 126 of the active layer 120 may be formed by thermally treating the first and the second insulation layer patterns 115 and 118, without an ion implantation process. The impurities included in the first and the second insulation layer patterns 115 and 118 may be diffused into portions of the active layer 120 by the thermal treatment, such that the source and the drain regions 122 and 126 may be formed in the active layer 120. In this case, the distance between the first and the second insulation layer patterns 115 and 118 may be substantially the same as a length of a channel region 124 defined by the source and the drain regions 122 and 126. Therefore, the source and the drain regions 122 and 126 may be obtained without damaging overlying structures, such as the active layer 120, by the ion implantation process.

According to the present exemplary embodiment, the active layer 120 may have the source and the drain regions 122 and 126 containing the impurities derived from the first and the second insulation layer patterns 115 and 118. The active layer 120 may include an oxide semiconductor containing at least one of indium (In), zinc (Zn), gallium (Ga), tin (Sn), titanium (Ti), aluminum (Al), hafnium (Hf), zirconium (Zr), and magnesium (Mg). Further, the source and the drain regions 122 and 126 may correspond to $N^+$ layers containing impurities such as hydrogen ions or fluorine ions. The hydrogen ions may serve as shallow donors so that the concentrations of carriers in the source and the drain regions 122 and 126 may be increased. The fluorine ions may reduce oxygen included in the active layer 120, such that free electrons may be generated in the source and the drain regions 122 and 126. Thus, the concentration of oxygen in the source and the drain regions 122 and 126 may be substantially lower than the concentration of oxygen in the channel region 124.

More particularly, the content of oxygen in the source and the drain regions 122 and 126 may be substantially lower than the content of oxygen in the channel region 124, so that the concentration of oxygen defects in the source and the drain regions 122 and 126 may be substantially higher than the concentration of oxygen defects in the channel region 124. This concentration of oxygen defects may generate the free electrons such that the concentration of carriers in the source and the drain regions 122 and 126 may be increased.

Because each of the source and the drain regions 122 and 126 may have a concentration of carriers substantially higher than that of the channel region 124, each of the source and the drain regions 122 and 126 may have a resistance substantially lower than that of the channel region 124. Accordingly, contact resistance between the source electrode 140 and the source region 122, and contact resistance between the drain electrode 145 and the drain region 126 may be reduced, and thus electrical characteristics of the oxide semiconductor device 100 may be improved.

According to the present exemplary embodiment, lengths of the channel region 124 may vary according to contents of the impurities in the source and the drain regions 122 and 126. For example, the length of the channel region 124 may be decreased as the contents of the impurities in the source and the drain regions 122 and 126 increase. Thus, the oxide semiconductor device 100 may have a reduced length. As the length of the channel region 124 is decreased, parasitic capacitance of the oxide semiconductor device 100 may be reduced, and thus a resistive-capacitive (RC) delay of the oxide semiconductor device 100 may be substantially reduced.

The active layer 120 of the oxide semiconductor device 100 may have a resistance obtained by subtracting the contact resistance between the source region 122 and the source electrode 140, and the contact resistance between the drain region 126 and the drain electrode 145 from the resistance of the channel region 124. According to the present exemplary embodiment, the contact resistance between the source region 122 and the source electrode 140 and the contact resistance between the drain region 126 and the drain electrode 145 may be decreased as described above, so that the entire resistance of the active layer 120 may be reduced. As a result, the oxide semiconductor device 100 may have improved electrical characteristics, such as reduced contact resistance, decreased parasitic capacitance, decreased channel length, increased carrier mobility, increased driving current, etc.

A conventional oxide semiconductor device may generally have an inverted staggered type, in which a gate electrode is positioned below an active layer and an etch stop layer is located on the active layer to protect the active layer. When the etch stop layer is provided on the active layer, overlapped areas of the source and the drain electrodes with respect to the gate electrode may be increased, thereby increasing parasitic capacitances between the gate electrode, the source electrode, and the drain electrode. Accordingly, length of the channel region of the active layer may not be properly reduced, such that the conventional oxide semiconductor device may not have a required minute size. Further, contact resistances between the active layer, the source electrode, and the drain electrode may not be properly controlled because of differences of work functions among the active layer, the source electrode, and the drain electrode. As a result, the conventional oxide semiconductor device may not provide desired electrical characteristics for a display device having a high resolution and a large size. When an organic light emitting display device includes the conventional oxide semiconductor device, the organic light emitting display device may have poor quality of images, reduced display rate of images, and increased power consumption due to RC delay in metal wirings thereof.

According to the present exemplary embodiment, the oxide semiconductor device 100 may include the source and the drain regions 122 and 126 containing the impurities derived from the first and the second insulation layer patterns 115 and 118. Hence, the contact resistance between the source region 122 and the source electrode 140, and the contact resistance between the drain region 126 and the drain electrode 145 may be decreased, to reduce the entire resistance of the active layer 120. Thus, the oxide semiconductor device 100 may have improved motility of carriers and increased driving current. When the oxide semiconductor device 100 has a staggered type, the channel region 124 of the active layer 120 may have a reduced length without considering a process margin for an etch stop layer, such that the oxide semiconductor device 100 may have a decreased size. In addition, parasitic capacitance between the gate electrode 130, the source electrode 140, and the drain electrode 145 may be considerably decreased. As a result, the oxide semiconductor device 100 may have a significantly reduced RC delay. When the oxide semiconductor device 100 according to the present exemplary embodiment is employed in an organic light emitting display device, the organic light emitting display device may implement a large size and display images with a high resolution.

Referring back to FIG. 1, the gate insulation layer 125 may be disposed on the substrate 110 to cover the active layer 120, the first insulation layer pattern 115, and the second insulation layer pattern 118. The gate insulation layer 125 may include silicon compound, metal oxide, etc.

The gate electrode 130 may be positioned on the gate insulation layer 125 disposed on the active layer 120. The gate electrode 130 may be disposed to overlap the channel region 124 of the active layer 120. The gate electrode 130 may include metal, metal alloy, metal nitride, conductive metal oxide, transparent conductive material, etc.

The insulating interlayer 135 may be disposed on the gate insulation layer 125 to cover the gate electrode 130. The insulating interlayer 135 may have a substantially level surface. The insulating interlayer 135 may include an organic material or an inorganic material.

The source electrode 140 and the drain electrode 145 may pass through the insulating interlayer 135 and the gate insulation layer 125, and contact the source region 122 and the drain region 126, respectively. As described above, the oxide semiconductor device 100 may have a staggered type that may not include an etch stop layer on the active layer 120, so that process margin for the etch stop layer may not be required. Additionally, the source and the drain regions 122 and 126 may be obtained without ion implantation process, such that damages to the overlying structures may be prevented.

FIGS. 2 to 7 are cross-sectional views illustrating a method of manufacturing an oxide semiconductor device according to an exemplary embodiment of the present invention.

Figure 2:
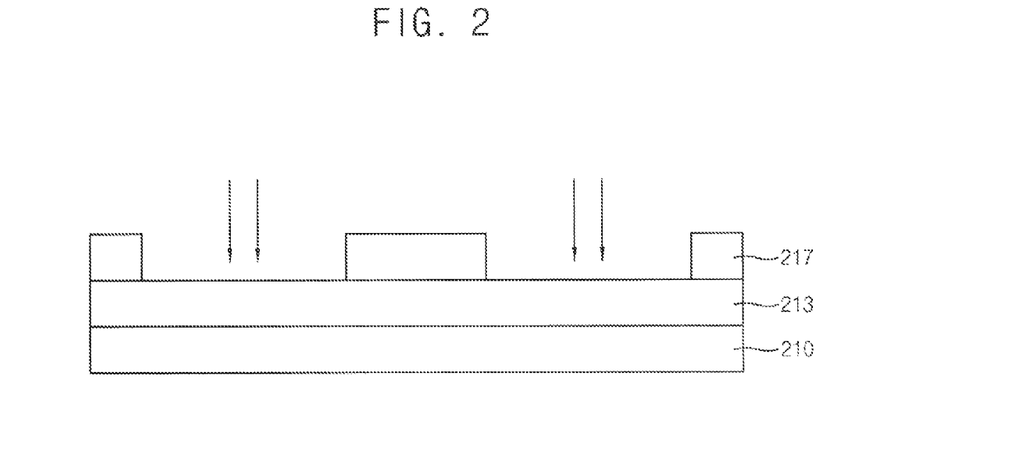
FIG. 2, FIG. 3, FIG. 4, FIG. 5, FIG. 6, and FIG. 7 are cross-sectional views illustrating a method of manufacturing an oxide semiconductor device according to an exemplary embodiment of the present invention.

Referring to FIG. 2, an insulation layer 213 may be formed on a substrate 210 including a soft transparent substrate or a hard transparent substrate. The insulation layer 213 may include a silicon compound.

A mask 217 may be formed on the insulation layer 213, and then impurities containing hydrogen or fluorine may be implanted into portions of the insulation layer 213 using the mask 217 as an ion implantation mask.

Figure 3:
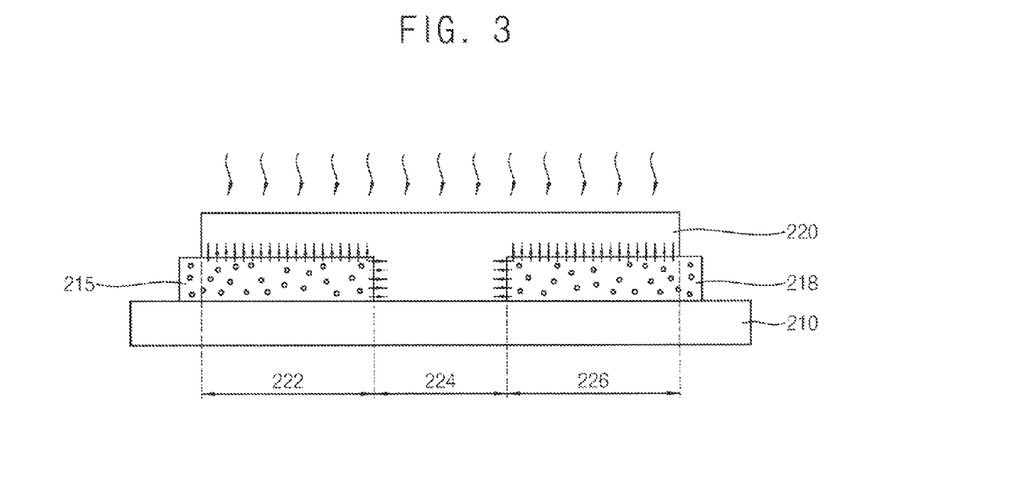

Referring to FIG. 3, the insulation layer 213 may be etched using the mask 217 as an etching mask, so that a first insulation layer pattern 215 and a second insulation layer 218 may be formed on the substrate 210. According to the present exemplary embodiment, each of the first and the second insulation layer patterns 215 and 218 may include silicon oxyfluoride ($SiO_xF_y$), silicon hydroxide ($Si(OH)_x$), silicon nitride ($SiN_x$), silicon oxynitride ($SiO_xN_y$), silicon fluoronitride ($SiF_yN_x$), etc. The first insulation layer pattern 215 may be separated from the second insulation layer pattern 218 by a predetermined distance, and a portion of the substrate 210 may be exposed between the first insulation layer pattern 215 and the second insulation layer pattern 218. After forming the first and the second insulation layer patterns 215 and 218, the mask 217 may be removed from the first and the second insulation layer patterns 215 and 218.

An active layer 220 may be formed on the substrate 210, the first insulation layer pattern 215, and the second insulation layer 218. The active layer 220 may be formed using an oxide semiconductor containing indium (In), zinc (Zn), gallium (Ga), tin (Sn), titanium (Ti), aluminum (Al), hafnium (Hf), zirconium (Zr), magnesium (Mg), etc. The active layer 220 may be disposed on the exposed portion of the substrate 210 and cover portions of the first and the second insulation layer patterns 215 and 218. End portions of the first and the second insulation layer patterns 215 and 218 may be exposed after forming the active layer 220.

The first and the second insulation layer patterns 215 and 218 may be thermally treated, such that the impurities contained in the first and the second insulation layer patterns 215 and 218 may be diffused to form a source region 222 and a drain region 226 in the active layer 220. Thermal treatment may include a rapid annealing process, a flash lamp annealing process, a laser annealing process, etc. The source and the drain regions 222 and 226 may include impurities containing hydrogen or fluorine by the thermal treatment, such that each of the source and the drain regions 222 and 226 may have concentration of carriers substantially higher than that of a channel region 224. Since the source and the drain regions 222 and 226 may be formed by diffusing the impurities from the first and the second insulation layer patterns 215 and 218 into portions of the active layer 220, damage to the gate insulation layer 225 and/or the active layer 220 from an ion implantation process may be prevented.

According to an exemplary embodiment of the present invention, the first and the second insulation layer patterns 215 and 218 may be formed by patterning an insulation layer 213 intrinsically including impurities without the ion implantation process. In this case, processes for forming the oxide semiconductor device may be simplified. Alternatively, the impurities included in the first and the second insulation layer patterns 215 and 218 may be diffused into a portion of a gate insulation layer 225 (see FIG. 4) through the active layer 220 by the thermal treatment. Hence, defect in the gate insulation layer 225 (e.g., oxygen vacancies) may be cured, so that electrical characteristics of the oxide semiconductor device may be further improved.

Figure 4:
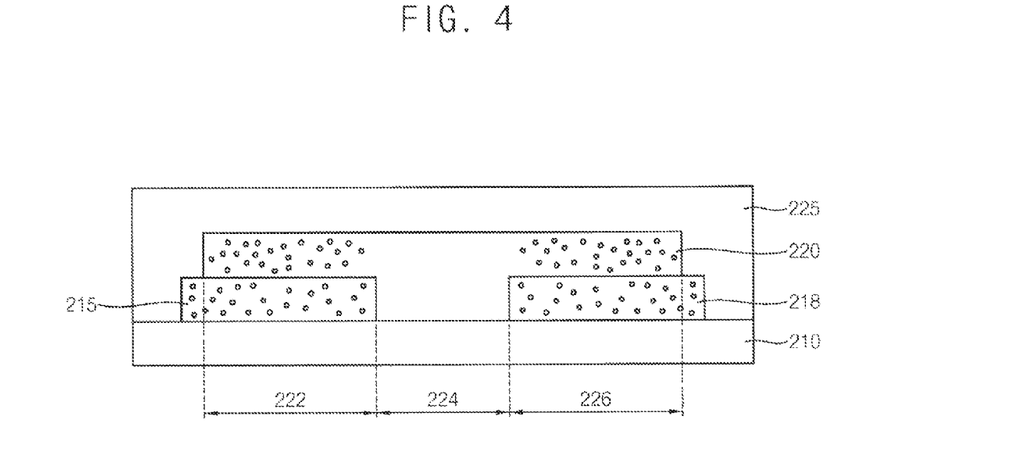

Referring to FIG. 4, the gate insulation layer 225 may be formed on the substrate 210 to cover the active layer 220, the first insulation layer pattern 215, and the second insulation layer pattern 218. The gate insulation layer 225 may have a sufficient thickness to entirely cover the active layer 220, the first insulation layer pattern 215, and the second insulation layer pattern 218. The gate insulation layer 225 may include silicon compound, metal oxide, etc.

Figure 5:
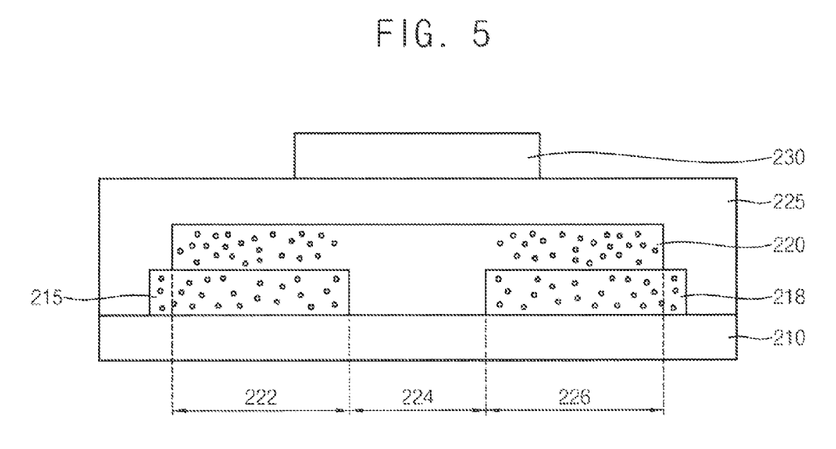

Referring to FIG. 5, a gate electrode 230 may be formed on the gate insulation layer 225. The gate electrode 230 may be formed directly over the channel region 224 of the active layer 220. The gate electrode 230 may include metal, metal alloy, metal nitride, conductive metal oxide, etc.

Figure 6:
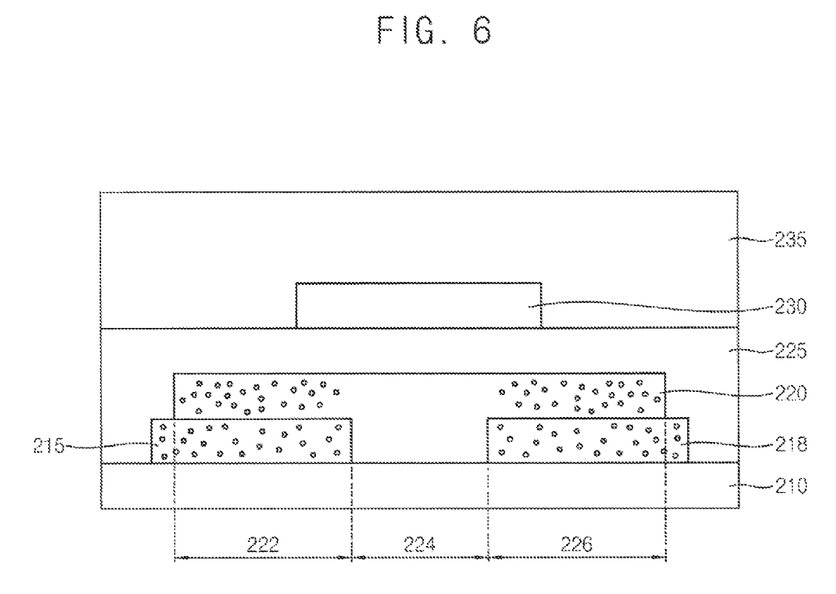

Referring to FIG. 6, an insulating interlayer 235 may be formed on the gate insulation layer 225 to cover the gate electrode 230. The insulating interlayer 235 may have a substantially flat surface and sufficiently cover the gate electrode 230. The insulating interlayer 235 may include an organic material or an inorganic material.

Figure 7:
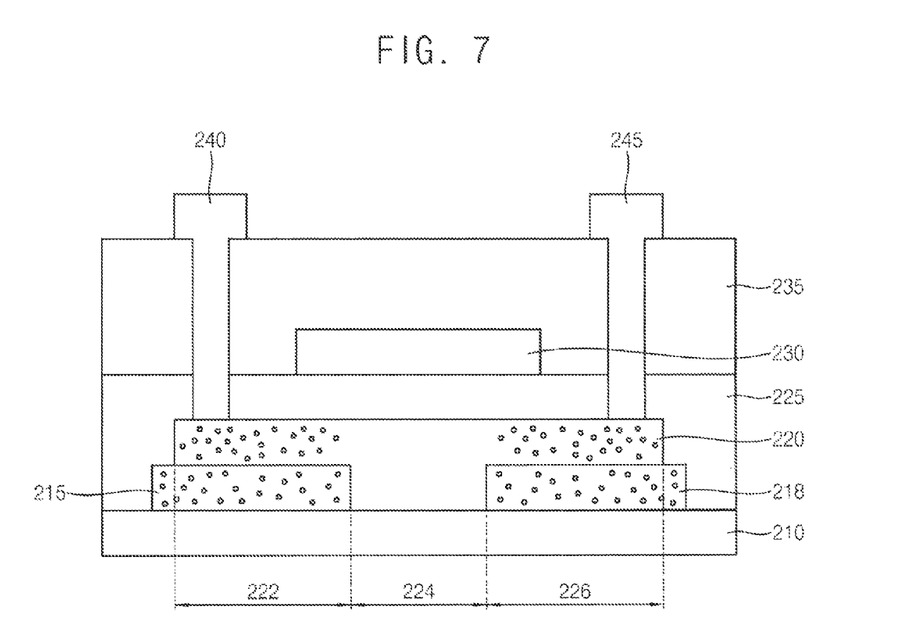

Referring to FIG. 7, the insulating interlayer 235 and the gate insulation layer 225 may be partially removed to form contact holes that expose the source and the drain regions 222 and 226, respectively. A source electrode 240 and a drain electrode 245 may be formed on the insulating interlayer 235 to fill the contact holes. The source and the drain electrodes 240 and 245 may contact the source and the drain regions 222 and 226, respectively. According to the present exemplary embodiment, the oxide semiconductor device having the staggered type may be obtained by the thermal treatment for forming the source and the drain regions 222 and 226. Thus, manufacturing processes and costs for the oxide semiconductor device may be reduced and improve electrical characteristics of the oxide semiconductor device.

Figure 8:
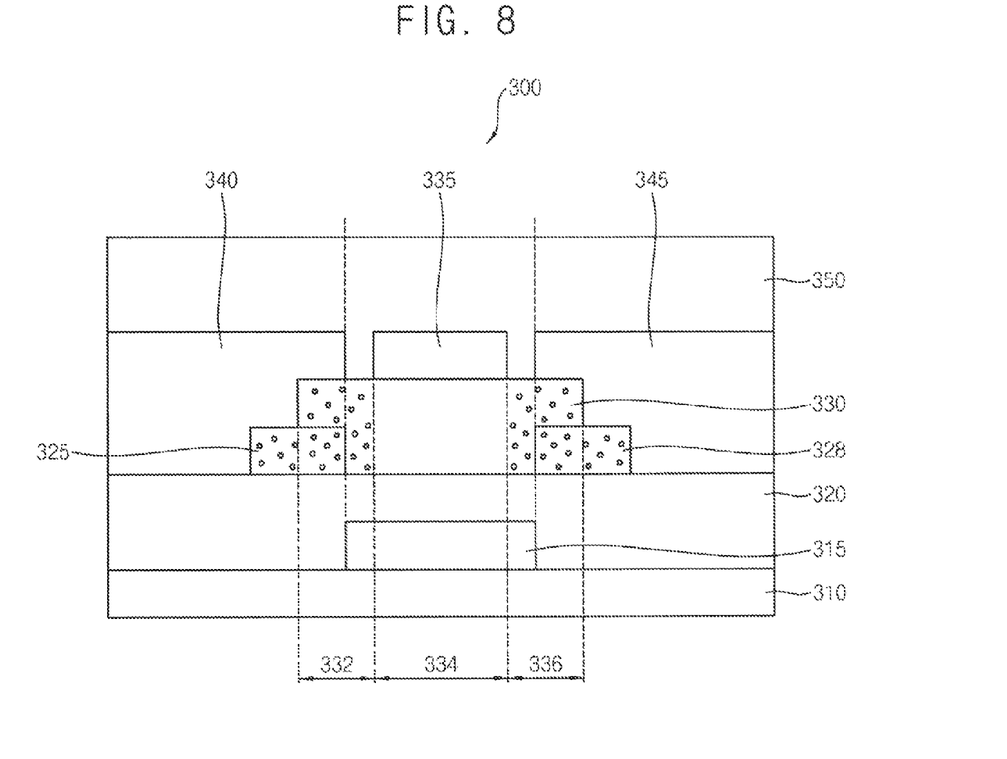
FIG. 8 is a cross-sectional view illustrating an oxide semiconductor device according to an exemplary embodiment of the present invention.

FIG. 8 is a cross-sectional view illustrating an oxide semiconductor device according to an exemplary embodiment of the present invention.

Referring to FIG. 8, an oxide semiconductor device 300 may include a substrate 310, a gate electrode 315, a gate insulation layer 320, a first insulation layer pattern 325, a second insulation layer pattern 328, an active layer 330, an etch stop layer 335, a source electrode 340, a drain electrode 345, and an insulating interlayer 350.

The substrate 310 may include a soft transparent insulation substrate or a hard transparent insulation substrate. According to the present exemplary embodiment, a buffer layer (not illustrated) may be provided on the substrate 310. The buffer layer may prevent the diffusion of impurities or ions from the substrate 310 into overlying structures.

The gate electrode 315 may be disposed on the substrate 310 and include metal, metal alloy, metal nitride, conductive metal oxide, transparent conductive material, etc. The gate insulation layer 320 may be positioned on the substrate 310 to cover the gate electrode 315. The gate insulation layer 320 may include silicon compound, metal oxide, etc.

The first and the second insulation layer patterns 325 and 328 may be disposed on the gate insulation layer 320. According to the present exemplary embodiment, each of the first and the second insulation layer patterns 325 and 328 may include impurities containing hydrogen or fluorine. When the first and the second insulation layer patterns 325 and 328 include hydrogen ions, the hydrogen ions may be diffused into portions of the active layer 330 and increase concentration of carriers, thereby forming a source region 332 and a drain region 336. When the first and the second insulation layer patterns 325 and 328 include fluorine ions, the fluorine ions may reduce oxygen in the active layer 330 and increase concentration of carriers, thereby forming the source and the drain regions 332 and 336 having free electrons. Each of the first and the second insulation layer patterns 325 and 328 may include silicon oxyfluoride, silicon hydroxide, silicon nitride, silicon oxynitride, silicon fluoronitride, etc.

As illustrated in FIG. 8, the active layer 330 may be disposed on the first insulation layer pattern 325, the second insulation layer pattern 328, and the gate insulation layer 320. The active layer 330 may have the source region 332, the drain region 336, and a channel region 334 between the source and the drain regions 332 and 336. The active layer 330 may include an oxide semiconductor including indium (In), zinc (Zn), gallium (Ga), tin (Sn), titanium (Ti), aluminum (Al), hafnium (Hf), zirconium (Zr), magnesium (Mg), etc. The source and the drain regions 332 and 336 may be formed by thermally treating the first and the second insulation layer patterns 325 and 328.

The impurities may be diffused from the first and the second insulation layer patterns 325 and 328 into portions of the active layer 330 to form the source and the drain regions 332 and 336. A length of the channel region 324 may decrease as the concentration of the impurities increases. Hence, the parasitic capacitance and the RC delay of the oxide semiconductor device may be substantially reduced.

Referring back to FIG. 8, the etch stop layer 335 may be disposed on the active layer 330. The etch stop layer 335 may be disposed on the channel region 334 of the active layer 330. The etch stop layer 335 may protect the channel region 334 during a process of forming the source electrode 340 and the drain electrode 345. The etch stop layer 335 may include silicon compound.

The source electrode 340 may be disposed on the gate insulation layer 320 to contact the source region 332 and the first insulation layer pattern 325. The drain electrode may also be disposed on the gate insulation layer 320 to contact the drain regions 336 and the second insulation layer pattern 328. According to the present exemplary embodiment, the source electrode 340 may cover a portion of the source region 332 and a portion of the first insulation layer pattern 325. The drain electrode 345 may cover portions of the drain region 336 and the second insulation layer pattern 328. Each of the source and the drain electrodes 340 and 345 may include metal, metal alloy, metal nitride, conductive metal oxide, transparent conductive material, etc.

According to the present exemplary embodiment, one end of the source electrode 340 may be positioned on a dashed line extending upwardly from one end of the gate electrode 315, and one end of the drain electrode 345 may be disposed on a dashed line extending upwardly from the other end of the gate electrode 315. More particularly, the gate electrode 315 may not be substantially overlapped with the source and the drain electrodes 340 and 345, such that the parasitic capacitance between the gate electrode 315, the source electrode 340, and the drain electrode 345 may be decreased when the etch stop layer 335 may be disposed on the channel region 334 of the active layer 330. Further, the first and the second insulation layer patterns 325 and 328 may be provided between the gate electrode 315 and the source and drain electrodes 340 and 345, so that the parasitic capacitance may be further reduced. Although each of the source and the drain electrodes 340 and 345 may have an increased thickness, to decrease the RC delay of the oxide semiconductor device 300, the increased thickness of the source and drain electrodes 340 and 345 may not substantially affect electrical characteristics of the oxide semiconductor device 300.

The insulating interlayer 350 may be disposed on the source electrode 340, the active layer 330, the etch stop layer 335, and the drain electrode 345. The insulating interlayer 350 may have a substantially level upper face. The insulating interlayer 350 may include an organic material or an inorganic material.

FIGS. 9 to 13 are cross-sectional views illustrating a method of manufacturing an oxide semiconductor device according to an exemplary embodiment of the present invention.

Figure 9:
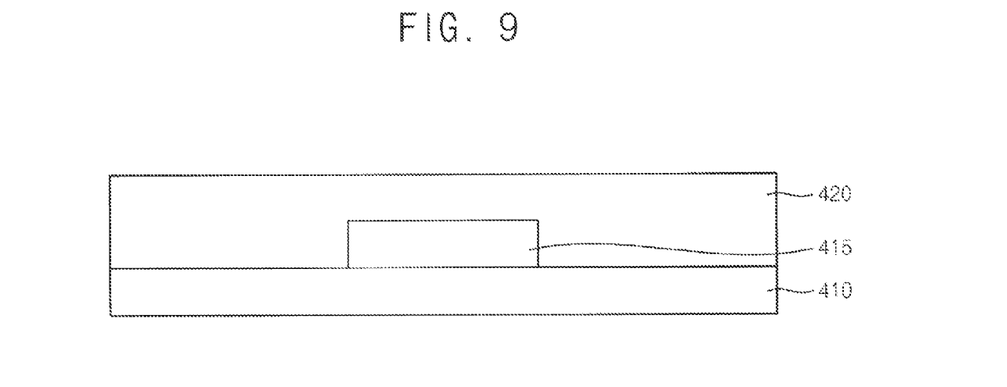
FIG. 9, FIG. 10, FIG. 11, FIG. 12, and FIG. 13 are cross-sectional views illustrating a method of manufacturing an oxide semiconductor device according to an exemplary embodiment of the present invention.

Referring to FIG. 9, a gate electrode 415 may be formed on a substrate 410 including a transparent insulation substrate, and then a gate insulation layer 420 may be formed on the substrate 410 to cover the gate electrode 415. The gate insulation layer 420 may have a thickness to sufficiently cover the gate electrode 415.

Figure 10:
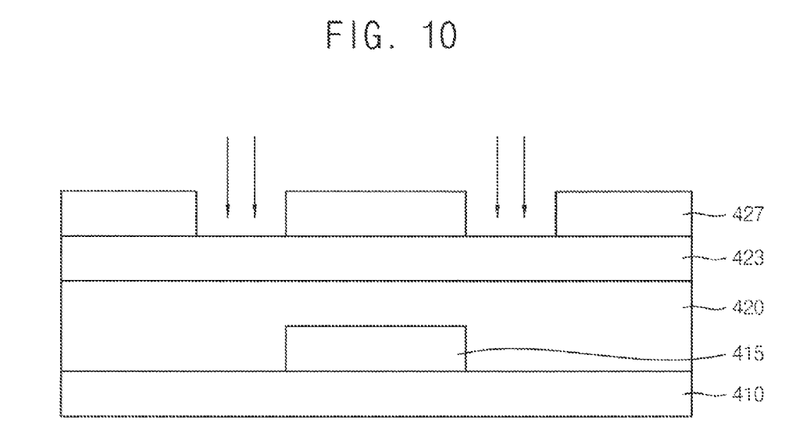

Referring to FIG. 10, an insulation layer 423 may be formed on the gate insulation layer 420, and then a mask 427 may be formed on the insulation layer 423. The mask 427 may partially expose the insulation layer 423. After impurities containing hydrogen or fluorine may be doped into portions of the insulation layer 423 exposed by the mask 427, the insulation layer 423 may be patterned using the mask 427 as an etching mask. Thus, a first insulation layer pattern 425 and a second insulation layer pattern 428 may be formed on the gate insulation layer 420. The first insulation layer pattern 425 may be spaced apart from the second insulation layer pattern 428 by a predetermined distance substantially the same to a length of the gate electrode 415. Each of the first and the second insulation layer patterns 425 and 428 may include silicon oxyfluoride, silicon hydroxide, silicon nitride, silicon oxynitride, silicon fluoronitride, etc. According to an exemplary embodiment of the present invention, the first and the second insulation layer patterns 425 and 428 may be formed by etching the insulation layer 423 using the mask 427, after forming the insulation layer 423 intrinsically including the impurities containing hydrogen or fluorine on the gate insulation layer 420. In this case, manufacturing processes for the oxide semiconductor device may be simplified.

Figure 11:
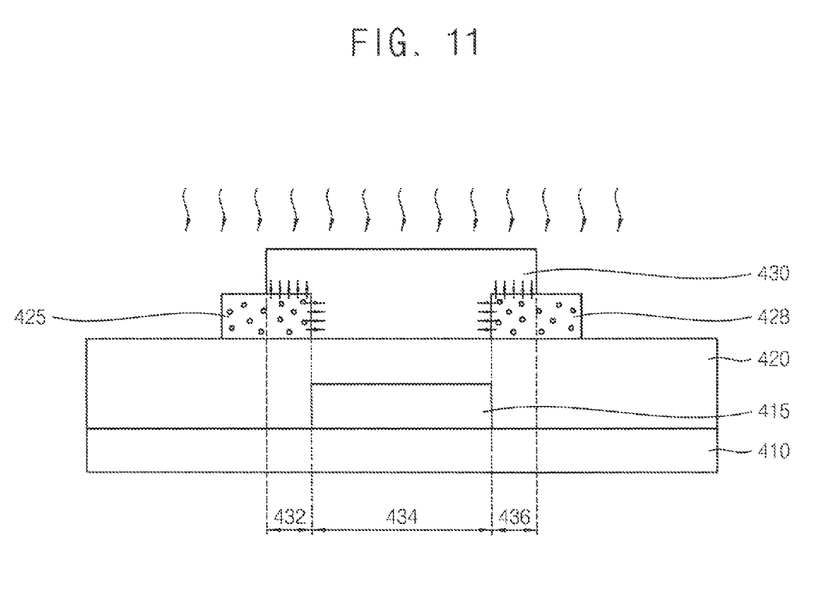

Referring to FIG. 11, an active layer 430 may be formed on the gate insulation layer 420, the first insulation layer pattern 425, and the second insulation layer pattern 428. The active layer 430 may expose side portions of the first and the second insulation layer patterns 425 and 428. The active layer 430 may be formed using oxide semiconductor including indium (In), zinc (Zn), gallium (Ga), tin (Sn), titanium (Ti), aluminum (Al), hafnium (Hf), zirconium (Zr), and magnesium (Mg), etc.

The active layer 430, the first insulation layer pattern 425, and the second insulation layer pattern 428 may be thermally treated, so that the impurities may be diffused from the first and the second insulation layer patterns 425 and 428 into portions of the active layer 430 contacting the first and the second insulation layer patterns 425 and 428. Accordingly, a source region 432 and a drain region 436 may be formed in the active layer 430, and thus a channel region 434 may be formed between the source region 432 and the drain region 436.

Figure 12:
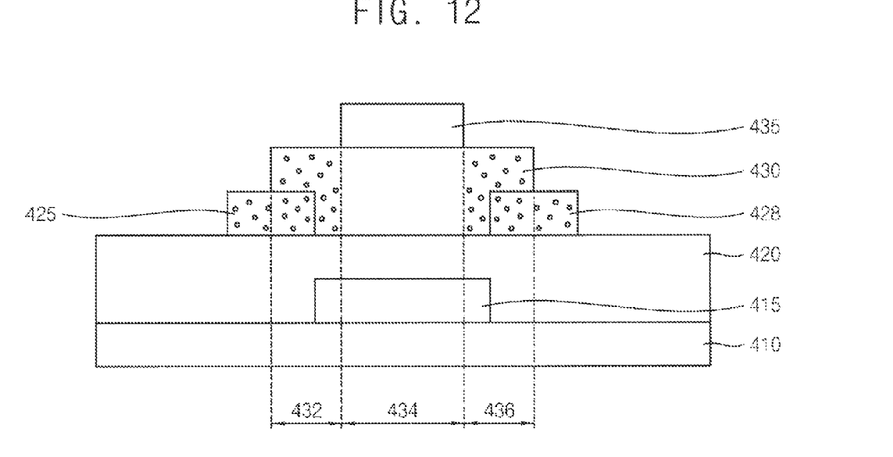

Referring to FIG. 12, an etch stop layer 435 may be formed on the channel region 434 of the active layer 430. The etch stop layer 435 may include silicon compound such as silicon oxide, silicon nitride, etc. The etch stop layer 435 may protect the channel region 434 in successive manufacturing processes.

Figure 13:
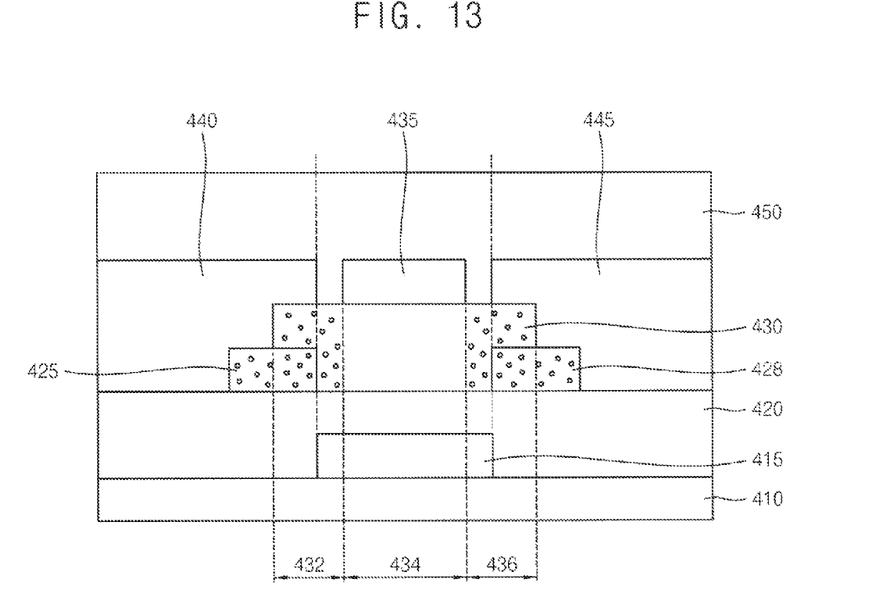

Referring to FIG. 13, a source electrode 440 and a drain electrode 445 may be formed to contact the source region 432 and the drain region 436, respectively. According to an exemplary embodiment of the present invention, a conductive layer (not illustrated) may be formed on the first insulation layer pattern 425, the active layer 430, the etch stop layer 435, and the second insulation layer pattern 328, and then the conductive layer may be patterned to form the source and the drain electrodes 440 and 445. The conductive layer may include metal, alloy, metal nitride, conductive metal oxide, etc. The source electrode 440 may cover the exposed side portion of the first insulation layer pattern 425 and a portion of the source region 432. In addition, the drain electrode 445 may cover the exposed side portion of the second insulation layer pattern 428 and a portion of the drain region 436.

As illustrated in FIG. 13, one end of the source electrode 440 may be disposed on a dashed line extending upwardly from one end of the gate electrode 415, and one end of the drain electrode 445 may be located on a dashed line extending upwardly from the other end of the gate electrode 415. Thus, the source and the drain electrodes 440 and 445 may not substantially overlap the gate electrode 415 to reduce parasitic capacitance between the gate electrode 415, the source electrode 440, and the drain electrode 445, although the etch stop layer 435 is formed on the active layer 430.

An insulating interlayer 450 may be formed on the etch stop layer 435, the source electrode 440, and the drain electrode 445. The insulating interlayer 450 may include an organic material or an inorganic material.

Figure 14:
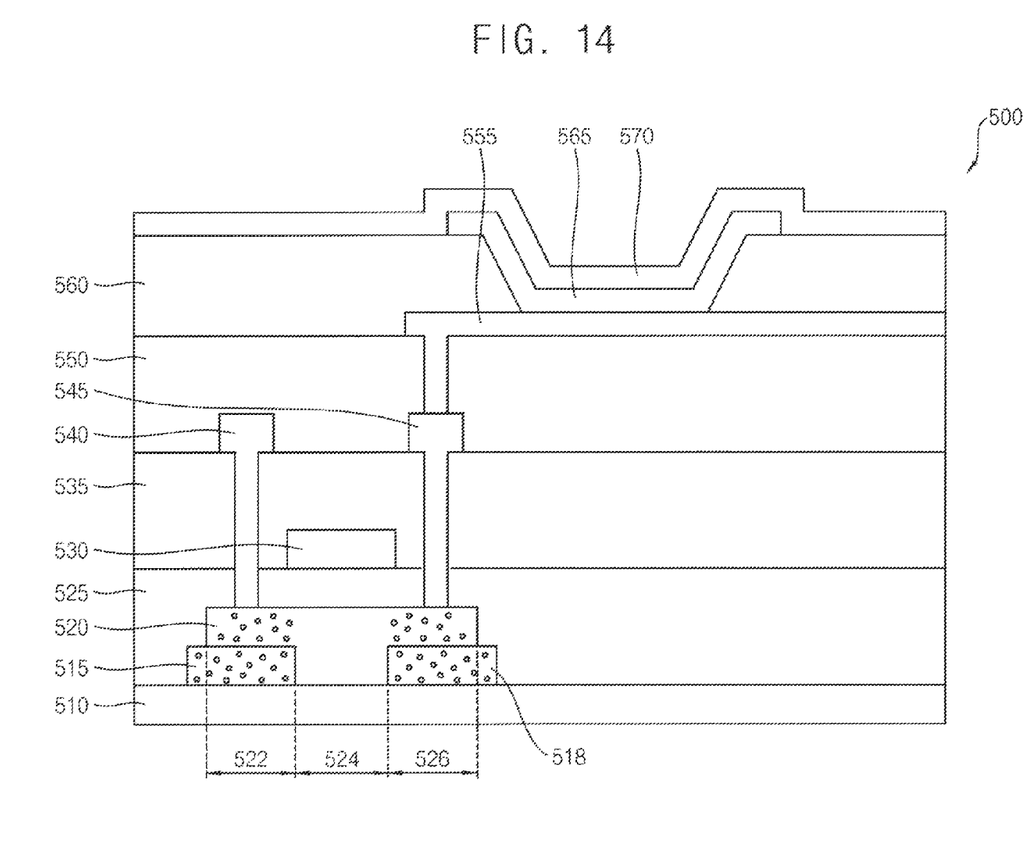
FIG. 14 is a cross-sectional view illustrating an organic light emitting display device according to an exemplary embodiment of the present invention.

FIG. 14 is a cross-sectional view illustrating an organic light emitting display device according to an exemplary embodiment of the present invention. The organic light emitting display device illustrated in FIG. 14 may include an oxide semiconductor device substantially the same as the oxide semiconductor device 100 described with reference to FIG. 1. Alternatively, the organic light emitting display device in FIG. 14 may include the oxide semiconductor device 300 illustrated in FIG. 8.

Referring to FIG. 14, an organic light emitting display device 500 may include a substrate 510, an oxide semiconductor device, an upper insulation layer 550, a first electrode 555, a pixel defining layer 560, a light emitting layer 565, a second electrode 570, etc. The oxide semiconductor device may include a first insulation layer pattern 515, a second insulation layer pattern 518, an active layer 520, a gate insulation layer 525, a gate electrode 530, an insulating interlayer 535, a source electrode 540, and a drain electrode 545. The elements of the oxide semiconductor device may be substantially the same as the oxide semiconductor device 100 illustrated in FIG. 1.

The upper insulation layer 550 may be disposed on the insulating interlayer 535 to sufficiently cover the source electrode 540 and the drain electrode 545. The upper insulation layer 550 may protect the oxide semiconductor device in successive manufacturing processes. The upper insulation layer 550 may include an organic material or an inorganic material.

The first electrode 555 may be disposed on the upper insulation layer 550. The first electrode 555 may pass through the upper insulation layer 550 and contact the drain electrode 545. The first electrode 555 may include a reflective material or a transmissive material in accordance with an emission type of the organic light emitting display device.

The pixel defining layer 560 may be located on the upper insulation layer 550 to cover the first electrode 555. The pixel defining layer 560 may have an opening that defines the luminance region of the organic light emitting display device. The opening of the pixel defining layer 560 may partially expose the first electrode 555. The pixel defining layer 560 may include an organic material or an inorganic material.

The light emitting layer 565 may be positioned on the exposed first electrode 555. The light emitting layer 565 may include an organic light emitting layer, a hole injection layer, a hole transfer layer, an electron transfer layer, an electron injection layer, etc. The organic light emitting layer 565 may include materials generating different colors of light, such as red color of light, green color of light, or blue color of light, in accordance with the types of the pixels in the organic light emitting display device. According to an exemplary embodiment of the present invention, the organic light emitting layer may have a stacked structure in which a plurality of materials generating different colors of light to emit white color of light.

The second electrode 570 may be disposed on the pixel defining layer 560 and the light emitting layer 565. The second electrode 570 may also include a reflective material or a transmissive material in accordance with the emission type of the organic light emitting display device.

The current organic light emitting display device may have increased RC delay since dimensions of metal wirings are reduced as the organic light emitting display device displays images with high resolution. When the dimensions of the metal wirings increase, the organic light emitting display device may not have required large size with high resolution. The organic light emitting display device 500 according to the present exemplary embodiment may include the oxide semiconductor device having a reverse staggered type or a staggered type, in which the source and the drain regions 522 and 526 of the active layer 520 may be derived from the first and the second insulation layer patterns 515 and 518. In this oxide semiconductor device, contact resistance between the source region 522 and the source electrode 540, and contact resistance between the drain region 526 and the drain electrode 545 may be decreased, and the length of the channel region 524 of the active layer 520 may be reduced. Because the oxide semiconductor device may have improved electrical characteristics, the organic light emitting display device 500 including the oxide semiconductor device may have improved characteristics, such as improved resolution of images, increased display rate of images, etc.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An oxide semiconductor device, comprising:
   a substrate;
   a first insulation layer pattern and a second insulation layer pattern disposed on the substrate;
   an active layer disposed on the first insulation pattern and the second insulation layer pattern, the active layer comprising a source region comprising the first insulation layer pattern, a drain region comprising the second insulation layer pattern, and a channel region disposed between the source region and the drain region wherein the source region and the drain region comprise impurities diffused from the first insulation layer pattern and the second insulation layer pattern, respectively;
   a source electrode contacting the source region; and
   a drain electrode contacting the drain region.

2. The oxide semiconductor device of claim 1, wherein the impurities comprise hydrogen or fluorine.

3. The oxide semiconductor device of claim 2, wherein each of the first and second insulation layer patterns comprises at least one of silicon oxyfluoride ($SiO_xF_y$), silicon hydroxide ($Si(OH)_x$), silicon nitride ($SiN_x$), silicon oxynitride ($SiO_xN_y$), and silicon fluoronitride ($SiF_yN_x$).

4. The oxide semiconductor device of claim 2, wherein the active layer comprises at least one of indium (In), zinc (Zn), gallium (Ga), tin (Sn), titanium (Ti), aluminum (Al), hafnium (Hf), zirconium (Zr), and magnesium (Mg).

5. The oxide semiconductor device of claim 1, wherein a length of the channel region varies according to impurity content of the source and drain regions.

6. The oxide semiconductor device of claim 1, further comprising a gate insulation layer disposed on the active layer, a gate electrode disposed on the gate insulation layer, and an insulating interlayer disposed on the gate insulation layer and the gate electrode.

7. The oxide semiconductor device of claim 6, wherein the source electrode and the drain electrode pass through the insulating interlayer and the gate insulation layer and contact the source region and the drain region, respectively.

8. The oxide semiconductor device of claim 1, further comprising:
   a gate electrode disposed on the substrate; and
   a gate insulation layer disposed on the gate electrode and the substrate,
   wherein the first and second insulation layer patterns are disposed on the gate insulation layer.

9. The oxide semiconductor device of claim 8, wherein:
   the source electrode contacts portions of the first insulation layer pattern and the source region; and
   the drain electrode contacts portions of the second insulation layer pattern and the drain region.

10. The oxide semiconductor device of claim 8, wherein the gate electrode does not overlap the source and drain electrodes.

11. The oxide semiconductor device of claim 8, further comprising an etch stop layer disposed on the active layer.

* * * * *